(12) United States Patent
Inoue et al.

(10) Patent No.: US 12,231,110 B2
(45) Date of Patent: Feb. 18, 2025

(54) ELECTRONIC COMPONENT AND METHOD OF MANUFACTURING ELECTRONIC COMPONENT

(71) Applicant: Murata Manufacturing Co., Ltd., Nagaokakyo (JP)

(72) Inventors: Kazunori Inoue, Nagaokakyo (JP); Shintaro Otsuka, Nagaokakyo (JP); Koichiro Kawasaki, Nagaokakyo (JP); Hidefumi Nakanishi, Nagaokakyo (JP); Masakazu Atarashi, Nagaokakyo (JP); Masahiro Fukushima, Nagaokakyo (JP); Yasuyuki Toyota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 386 days.

(21) Appl. No.: 17/745,443

(22) Filed: May 16, 2022

(65) Prior Publication Data

US 2022/0278668 A1    Sep. 1, 2022

Related U.S. Application Data

(63) Continuation of application No. PCT/JP2020/041645, filed on Nov. 9, 2020.

(30) Foreign Application Priority Data

Nov. 18, 2019 (JP) .................. 2019-207808

(51) Int. Cl.
*H03H 9/10* (2006.01)
*H03H 3/08* (2006.01)
*H03H 9/145* (2006.01)

(52) U.S. Cl.
CPC ............ *H03H 9/1092* (2013.01); *H03H 3/08* (2013.01); *H03H 9/145* (2013.01)

(58) Field of Classification Search
CPC ......... H03H 9/1092; H03H 9/145; H03H 3/08
See application file for complete search history.

(56) References Cited

U.S. PATENT DOCUMENTS

| 7,385,463 B2 | 6/2008 | Koga et al. |
| 2011/0012695 A1* | 1/2011 | Yamaji ................ H03H 9/1092 333/193 |
| 2011/0115339 A1 | 5/2011 | Makibuchi et al. |

FOREIGN PATENT DOCUMENTS

| JP | 2007-096597 A | 4/2007 |
| JP | 2012-005033 A | 1/2012 |

(Continued)

OTHER PUBLICATIONS

Machine Translation of JP2012109925 (Year: 2012).*
Official Communication issued in International Patent Application No. PCT/JP2020/041645, mailed on Dec. 15, 2020.

*Primary Examiner* — Samuel S Outten
(74) *Attorney, Agent, or Firm* — Keating & Bennett, LLP

(57) ABSTRACT

An electronic component includes a substrate, a functional element on the substrate, a first electrode, a support body that is made of an insulator, a cover portion, a second electrode, and a projection. The first electrode is located on the substrate and connected to the functional element. The support body protrudes from the substrate and covers the first electrode. The cover portion opposes the substrate, and a hollow space is defined by the substrate, the support body, and the cover portion. The second electrode is located in a via hole extending through the support body and the cover portion and electrically connected to the first electrode. The projection is located on the first electrode in the via hole.

15 Claims, 11 Drawing Sheets

(56) References Cited

FOREIGN PATENT DOCUMENTS

JP 2012109925 A * 6/2012
WO 2009/157587 A1 12/2009

* cited by examiner

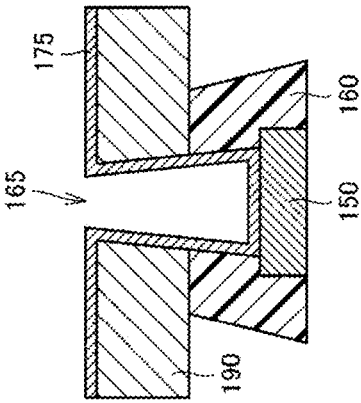
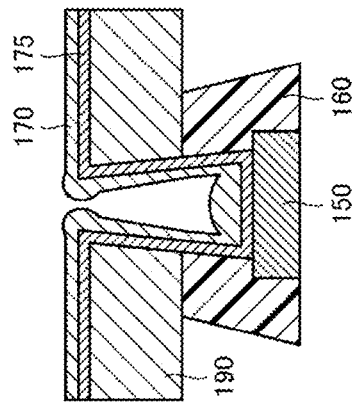
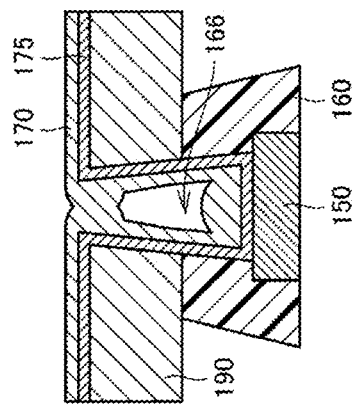

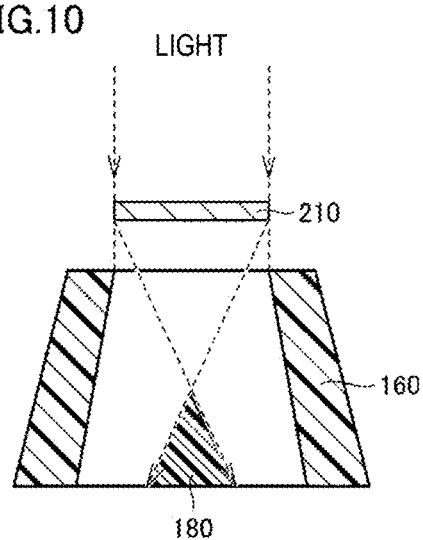

ELECTRONIC COMPONENT AND METHOD OF MANUFACTURING ELECTRONIC COMPONENT

CROSS REFERENCE TO RELATED APPLICATIONS

This application claims the benefit of priority to Japanese Patent Application No. 2019-207808 filed on Nov. 18, 2019 and is a Continuation application of PCT Application No. PCT/JP2020/041645 filed on Nov. 9, 2020. The entire contents of each application are hereby incorporated herein by reference.

BACKGROUND OF THE INVENTION

1. Field of the Invention

The present disclosure relates to an electronic component and a method of manufacturing the electronic component, and in particular, to a structure of an electronic component that has a wafer level package (WLP) structure and in which a functional element is located in a hollow space.

2. Description of the Related Art

U.S. Pat. No. 7,385,463 discloses a surface acoustic wave (SAW) device that has the WLP structure and in which interdigital transducer (IDT) electrodes are disposed on a piezoelectric substrate. Such a SAW device has a hollow space formed therein. The hollow space is provided to enable the IDT electrodes to vibrate on the piezoelectric substrate.

SUMMARY OF THE INVENTION

In the electronic component of which the above SAW device is a representative example, a supporting layer is provided between a substrate and a cover portion to form the hollow space, and via holes (through-holes) are formed through the supporting layer and the cover portion. In the via holes, connection electrodes are formed to electrically connect functional elements, such as the IDT electrodes, to an external element or an external device.

The connection electrodes may be formed by electrolytic plating. In electrolytic plating, if a member to be plated has a protruding edge, the electric field is known to be concentrated on such an edge, thereby increasing the plating thickness compared with other portions. When the through-hole is plated as described above, the electric field may be concentrated at the opening edge (entrance) of the through-hole. This accelerates metal growth at the opening edge compared with other portions inside the through-hole. In the case of the through-hole having a small diameter, the opening of the through-hole may be plugged while a cavity (void) remains inside the through-hole.

If the void is formed inside the through-hole, the air in the void may swell or contract in case of a sudden change in ambient temperature, which may cause the plated metal to be detached or to develop cracks. Moreover, in the case of the small-diameter through-hole, the plating thickness on the surface of the through-hole may become insufficient, which may increase the resistance of the connection electrode or may cause breakage thereof. This leads to impairment of the reliability of the electronic component.

Preferred embodiments of the present invention suppress or prevent void generation in an electrode located in a through-hole to improve reliability of an electronic component including a hollow space.

An electronic component according to an aspect of a preferred embodiment of the present disclosure includes a substrate, a functional element on the substrate, a first electrode, a support body that is made of an insulator, a cover portion, a second electrode, and a projection. The first electrode is located on the substrate and electrically connected to the functional element. The support body protrudes from the substrate and covers the first electrode. The cover portion opposes the substrate, and a hollow space is defined by the substrate, the support body, and the cover portion. The second electrode is located in a via hole extending through the support body and the cover portion and electrically connected to the first electrode. The projection is located on the first electrode in the via hole.

A method of manufacturing an electronic component according to another aspect of a preferred embodiment of the present disclosure includes forming a functional element and a first electrode on a substrate, the functional element being electrically connected to the first electrode, forming a support body on the substrate, the support body covering the first electrode, locating a cover portion so as to oppose the substrate to form a hollow space defined by the substrate, the support body, and the cover portion, forming a via hole through the cover portion and the support body and forming a projection on the first electrode in the via hole, and forming a second electrode inside the via hole, the second electrode being electrically connected to the first electrode.

In an electronic component according to a preferred embodiment of the present disclosure, the projection is provided on the first electrode in the via hole in which the second electrode is to be formed. The projection accelerates metal growth inside the through-hole. This reduces the difference in metal thickness between the opening edge and the surface of the through-hole to reduce the likelihood of void generation in the through-hole. This can improve the reliability of the electronic component.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A to 3C are views for explaining a problem that may arise when a through-hole via is formed.

FIG. 10 is a view for explaining a mechanism of forming a projection inside a via hole in the manufacturing process of FIGS. 8 and 9.

DETAILED DESCRIPTION OF THE PREFERRED EMBODIMENT

Preferred embodiments of the present invention will be described in detail with reference to the drawings. Note that the same or equivalent components will be denoted by the same reference signs, and duplicated explanations will not be provided.

Structure of Electronic Component

Figure 1:
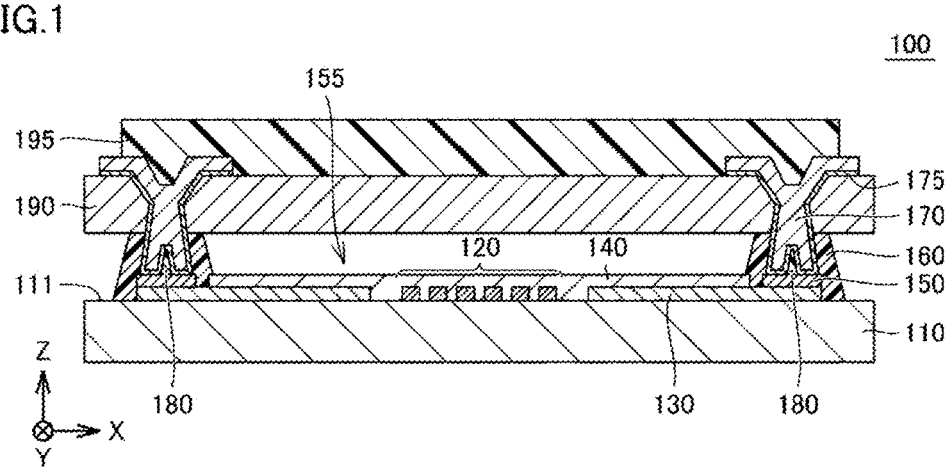
FIG. 1 is a side view illustrating an interior of an electronic component according to a preferred embodiment of the present invention.
Figure 2:
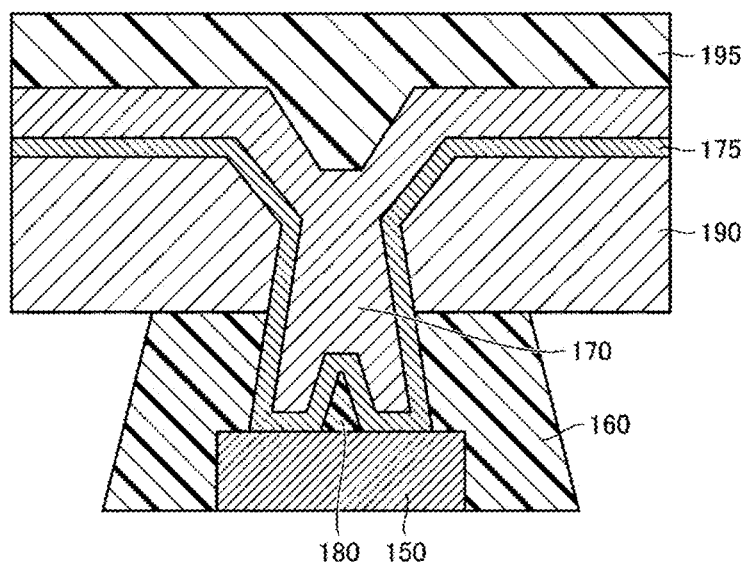
FIG. 2 is an enlarged view illustrating a portion of a support body in FIG. 1.

FIG. 1 is a side view illustrating the interior of an electronic component 100 according to a preferred embodiment. FIG. 2 is an enlarged view illustrating a portion of a support body 160 in FIG. 1. Referring to FIGS. 1 and 2, the electronic component 100 includes a substrate 110, a functional element 120, a support body 160, connection electrodes 170 in the support body 160, a cover portion 190, and protective layers 140 and 195. Note that as described in the present preferred embodiment, the electronic component 100 may define and function as a surface acoustic wave (SAW) device. In this case, the substrate 110 may be formed as a piezoelectric substrate, and the functional element 120 may include IDT electrodes. Accordingly, the substrate 110 may be referred to also as a "piezoelectric substrate 110". Note that in FIG. 1, a side of the electronic component 100 that faces in the positive direction of the Z-axis may be referred to as the upper side, and the other side that faces in the negative direction of the Z-axis may be referred to as the lower side.

For example, the piezoelectric substrate 110 may be made of a piezoelectric single-crystal material, such as lithium tantalate ($LiTaO_3$), lithium niobate ($LiNbO_3$), alumina, silicon (Si), or sapphire, or of a piezoelectric laminated material made of $LiTaO_3$ or $LiNbO_3$. A plurality of the functional elements 120 are provided on a first surface 111 of the piezoelectric substrate 110. The functional elements 120 include pairs of IDT electrodes made of a single-metal electrode material that contains at least one of aluminum, copper, silver, gold, titanium, tungsten, platinum, chromium, nickel, and molybdenum, or made of an alloy electrode material that contains above metals as main ingredients. The piezoelectric substrate 110 and the functional elements (IDT electrodes) 120 define the surface acoustic wave (SAW) resonator.

Wiring electrodes 130 are provided on the first surface 111 of the piezoelectric substrate 110 on which the functional elements 120 are located. The wiring electrodes 130 electrically connect the functional elements 120 to each other and also connect the functional elements 120 to the connection electrodes 170. Terminal electrodes 150 are provided on the wiring electrodes 130. The terminal electrodes 150 are provided for connection with the connection electrodes 170.

The support body 160 protrudes from the first surface 111 of the piezoelectric substrate 110 in the positive direction of the Z-axis. The support body 160 is shaped like a wall that surrounds the functional elements 120. The support body 160 is made of an insulating resin and/or a photosensitive resin, such as an epoxy or polyimide resin. A portion of the support body 160 covers the terminal electrodes 150.

The cover portion 190 is supported by the support body 160 and positioned so as to oppose the first surface 111 of the piezoelectric substrate 110. For example, the cover portion 190 is made of a resin and/or a photosensitive resin containing an epoxy, polyimide, acrylic, or urethane resin, or the like, as a main ingredient. In addition to the above resins, the cover portion 190 may be made partially of a metal. A hollow space 155 is defined by the piezoelectric substrate 110, the support body 160, and the cover portion 190. The functional elements 120 are provided inside the hollow space 155. In the hollow space 155, a protective layer 140 made of an insulting material covers the functional elements 120 and the wiring electrodes 130 to protect these components.

The connection electrodes 170 are formed inside via holes (through-holes) that pierce the support body 160 and the cover portion 190. The connection electrodes 170 are located at the positions of respective terminal electrodes 150 when the electronic component 100 is viewed in the Z-axis direction. A metallic seed layer 175 is formed in advance by sputtering or the like in the through-hole in which each connection electrode 170 is to be formed. The connection electrode 170 is formed on the seed layer 175 by electrolytic plating.

Each connection electrode 170 is electrically connected to the corresponding terminal electrode 150 via the seed layer 175. A portion of the connection electrode 170 (i.e., an extended portion 171) is extended over the cover portion 190, and the extended portion 171 is coupled to an external device or an external element (not illustrated), which is hereinafter referred to simply as an "external device". Thus, the functional elements 120 are electrically connected to the external device.

In the electronic component 100 of the present preferred embodiment, a projection 180 is provided at the bottom in the through-hole for each connection electrode 170 (in other words, provided on each terminal electrode 150). The projection 180 is structured to prevent a cavity (void) from occurring inside the connection electrode 170 during the formation of the connection electrode 170. The projection 180 will be described in detail later.

A protective layer 195 is disposed so as to cover the cover portion 190 and the connection electrodes 170. For example, the protective layer 195 is made of a material in which an inorganic filler, such as a metal filler, is mixed with a water repellent, such as a silicon compound, an epoxy-based resin, a silicone-based resin, a fluorine-based resin, or an acrylic-based resin. Forming the protective layer 195 using such a material can improve the moisture resistance and shock resistance of the electronic component 100. A portion of the protective layer 195 is cut out at the extended portion 171 of each connection electrode 170, which enables the external device to be coupled to the connection electrode 170.

Operation of Projection

Figure 4:
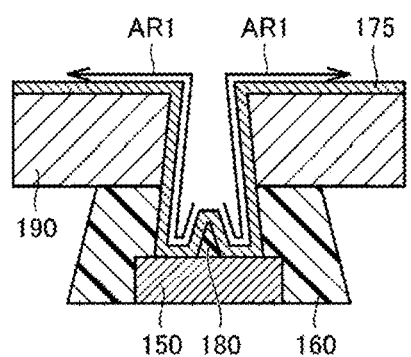
FIG. 4 is a view for explaining a reason why formation of a projection suppresses or prevents void generation.

Next, a projection 180 formed in each through-hole will be described with reference to FIGS. 3 and 4.

As described above, each connection electrode 170, which electrically connects the corresponding terminal electrode 150 to the external device, is formed by electrolytic plating. As illustrated in FIG. 3A, when the connection electrode 170 is formed, a through-hole 165 is first formed by removing a portion of the support body 160 and a portion of the cover portion 190 that correspond to the position of the terminal electrode 150. The seed layer 175 is subsequently formed in the through-hole 165 by sputtering.

Subsequently, the connection electrode 170 is formed on the seed layer 175 by electrolytic plating. Here, the electric field tends to be concentrated at a protruding edge, such as the opening edge of the through-hole 165, which concentrates metal ions at the protruding edge and causes the plating thickness to increase compared with other portions. On the other hand, the plating thickness tends to decrease at corners near the bottom in the through-hole 165 compared with other portions (FIG. 3B). As a result, metal growth is accelerated near the opening edge of the through-hole 165 compared with the bottom in the electrolytic plating process. This may cause the plating metal to plug the opening of the through-hole 165 before the plating thickness inside the through-hole 165 reaches a desired level. Consequently, a cavity (void) 166 may be formed inside the connection electrode 170 as illustrated in FIG. 3C.

If the void 166 is formed inside the through-hole 165, the air in the void 166 may swell or contract in case of a sudden change in ambient temperature, which may cause the connection electrode 170 to be detached from the seed layer 175 or to develop cracks. In the case of the through-hole having a small diameter, the plating thickness at the surface of the through-hole 165 may become insufficient, which may increase the resistance of the connection electrode 170 or may cause breakage thereof.

In the electronic component 100 of the present preferred embodiment, however, the projection 180 made of an insulating material or of a metal is formed on the terminal electrode 150 at the bottom in the through-hole, and the seed layer 175 is formed also on the surface of the projection 180. As described above, the electric field tends to be concentrated at the projection. Accordingly, the projection 180 accelerates the metal growth at the bottom in the through-hole. The concentration of the electric field promotes plating currents to run from the projection 180 along the seed layer 175 in the directions of arrow AR1 in FIG. 4, which accelerates metal growth on the side surface of the through-hole. Moreover, the projection 180 can reduce the volume of the metal required to fill the through-hole. Thus, formation of the projection 180 at the bottom in the through-hole can reduce the likelihood of the void formation inside the through-hole, which can eventually improve the reliability of the electronic component 100.

If the height (dimension in the Z-axis direction) of the projection 180 is too great, a narrow space may be created between the projection 180 and the surface of the through-hole, which may increase the likelihood of void formation. Accordingly, the height of the projection 180 from the terminal electrode 150 is preferably smaller than one-third of the height of the support body 160.

Manufacturing Process

Three example processes of manufacturing the electronic component 100 of the present preferred embodiment will be described with reference to FIGS. 5 to 12.

First Example Process

Referring to FIGS. 5A to 5D and 6E to 6G, the first example process of manufacturing the electronic component 100 will be described. The manufacturing process includes steps shown in FIGS. 5A to 6G.

Figure 5A:
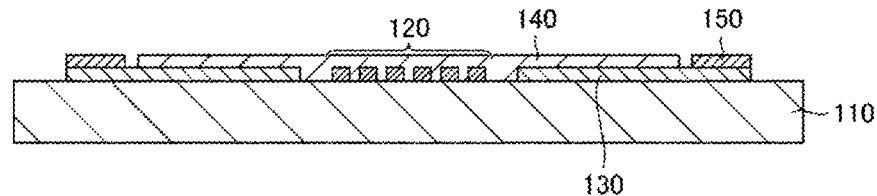
FIGS. 5A to 5D are first views for explaining a first example process of manufacturing the electronic component according to the present preferred embodiment of the present invention.

Referring to FIGS. 5A to 5D and 6E to 6G, in FIG. 5A, the functional elements 120, the wiring electrodes 130, and the terminal electrodes 150 are formed on the piezoelectric substrate 110. For example, in the formation of the functional elements 120, the wiring electrodes 130, and the terminal electrodes 150, a metal film made of copper or others is first formed on the piezoelectric substrate 110 by sputtering, and subsequently, the metal film is processed by patterning, etching, and the like. In FIGS. 5A to 5D, the wiring electrodes 130 and the terminal electrodes 150 are illustrated as separate elements. The wiring electrodes 130 and the terminal electrodes 150, however, may be made integrally of the same material. The protective layer 140 is laminated on a portion of the wiring electrodes 130 excluding the terminal electrodes 150 and also on the functional elements 120.

Figure 5B:
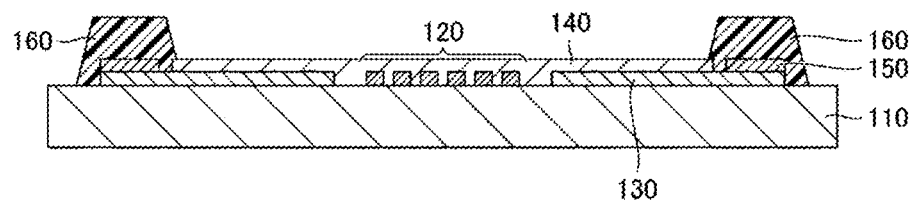

Next, in FIG. 5B, the support body 160 is formed so as to cover the terminal electrodes 150 and to surround the functional elements 120. For example, the support body 160 may be formed by laminating an insulating resin layer at a target position. In the case of the support body 160 being made of a negative-photoresist-type photosensitive resin having photo-curing properties, a photosensitive resin sheet is laminated on the workpiece produced in FIG. 5A, and portions to remain are exposed to light. The light-exposed resin sheet is developed to form the support body 160.

Figure 5C:
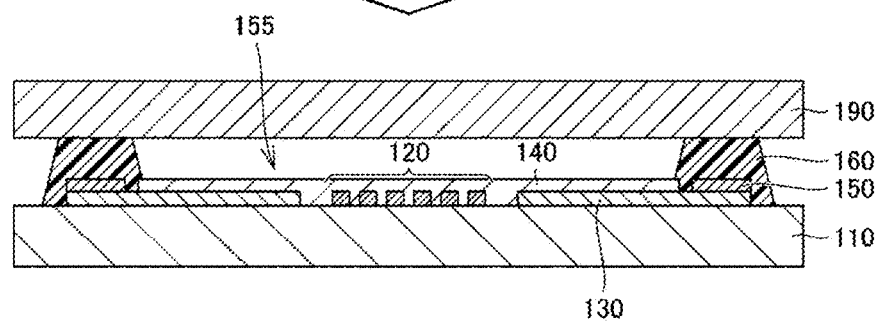

In FIG. 5C, the cover portion 190 is formed on the support body 160. The hollow space 155 is thus formed. The cover portion 190 is formed by laminating a dielectric plate on the support body 160. Alternatively, in the case of the cover portion 190 being made of the photosensitive resin having photo-curing properties, the cover portion 190 is formed by laminating a photosensitive resin sheet on the workpiece produced in FIG. 5B and by exposing the photosensitive resin sheet to light.

Figure 5D:
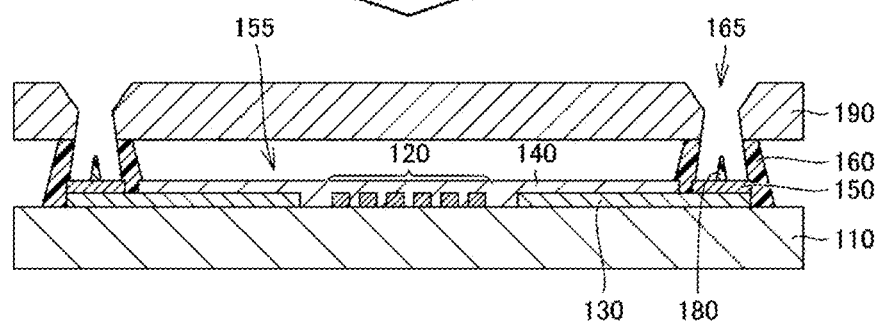
Figure 7:
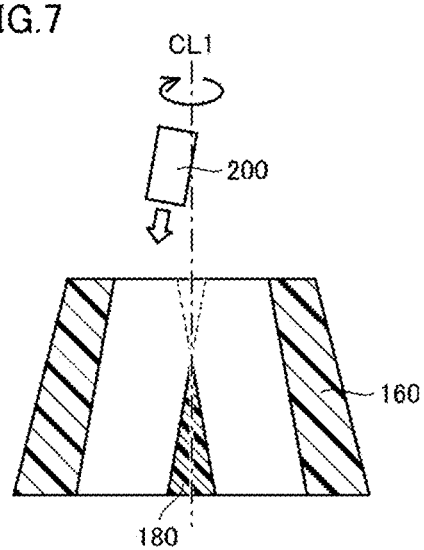
FIG. 7 is a view for explaining a mechanism of forming a projection in a via hole in the manufacturing process of FIGS. 5 and 6.

In FIG. 5D, each through-hole 165 is formed through the cover portion 190 and the support body 160 using laser light. When the through-hole is formed in the support body 160 in FIG. 5D, the support body 160 is irradiated with laser light from a laser light source 200 as illustrated in FIG. 7 while the laser light source 200 is inclined slightly from the rotation axis CL1 that extends in the vertical direction and is rotated around the rotation axis CL1. Accordingly, the diameter of the through-hole near the piezoelectric substrate 110 (i.e., at the bottom in the through-hole) is formed to be larger than the diameter of the through-hole near the cover portion 190. Due to the straightness of laser light, the laser processing leaves a substantially conical remnant near the bottom in the through-hole. The conical remnant becomes the projection 180. In the first example process, the projection 180 is made of the same material as the support body 160.

In the method illustrated in FIG. 7, however, the diameter of the through-hole near the top surface of the cover portion 190 becomes too small. Accordingly, the position of the laser light source 200 is shifted, after the support body 160 is processed, so as to be able to increase the diameter of the through-hole near the top surface of the cover portion 190. Thus, the through-hole 165 as illustrated in FIG. 5D can be formed.

Figure 6E:
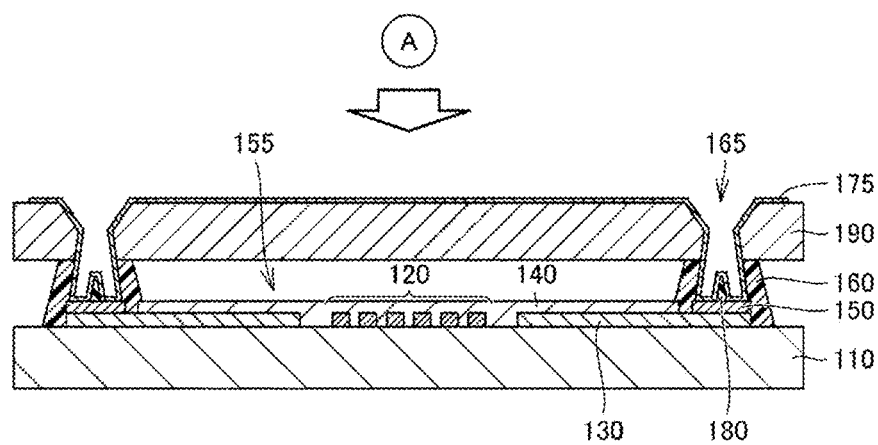
FIGS. 6E to 6G are second views for explaining the first example process of manufacturing the electronic component according to the present preferred embodiment of the present invention.

Next, in FIG. 6E, the seed layer 175 is formed by sputtering on the surface of the through-hole 165 and also on the top surface of the cover portion 190.

Figure 6F:
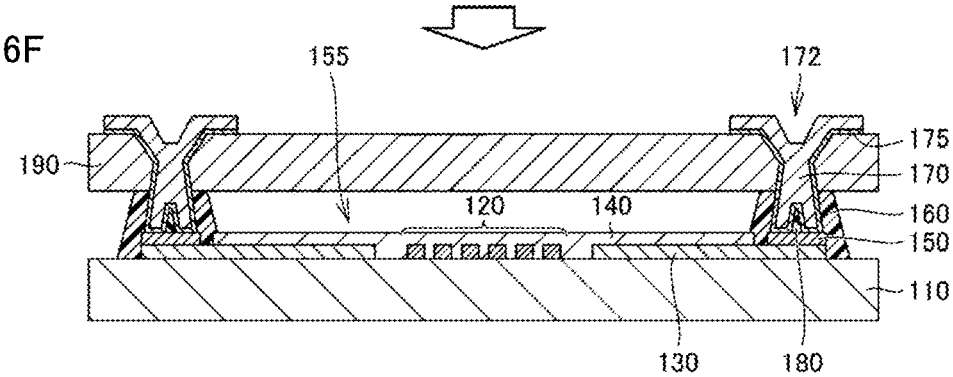

In FIG. 6F, the connection electrode 170 is formed by electrolytic plating on the seed layer 175 formed in FIG. 6E.

More specifically, a photoresist is patterned so as to cover unplated regions, and after the plating process, the photoresist and seed layer beneath the photoresist are removed together. In the plating process, the plating thickness becomes substantially uniform except for edge portions or the like. Accordingly, a recess 172 is formed in the connection electrode 170 near the top surface of the cover portion 190.

Figure 6G:
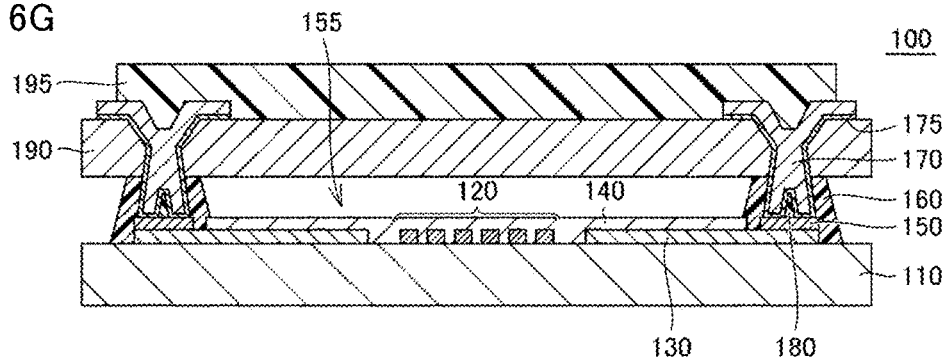

Subsequently, in FIG. 6G, the protective layer 195 is laminated over the connection electrodes 170 and the cover portion 190. Thus, the electronic component 100 is completed.

As described above, the electronic component 100 having the structure illustrated in FIG. 1 is formed via the steps shown in FIGS. 5A to 5D and 6E to 6G.

Second Example Process

Figure 8A:
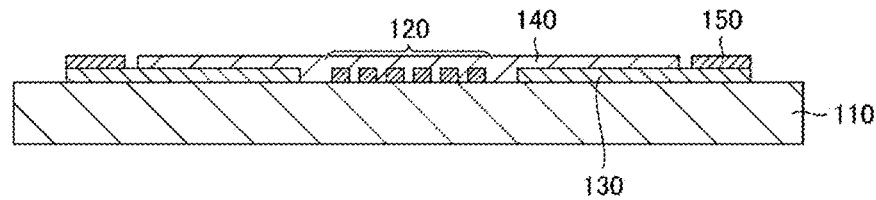
FIGS. 8A to 8D are first views for explaining a second example process of manufacturing the electronic component according to the present preferred embodiment of the present invention.
Figure 8B:
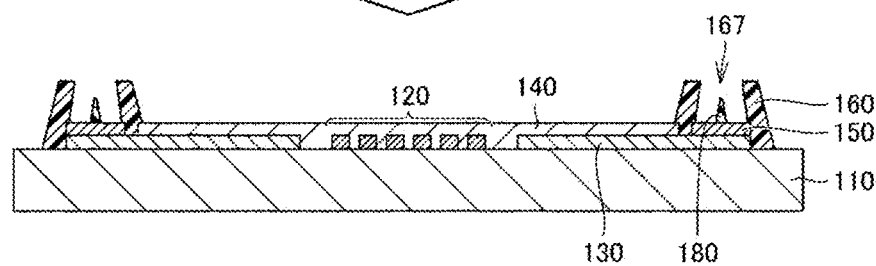
Figure 8C:
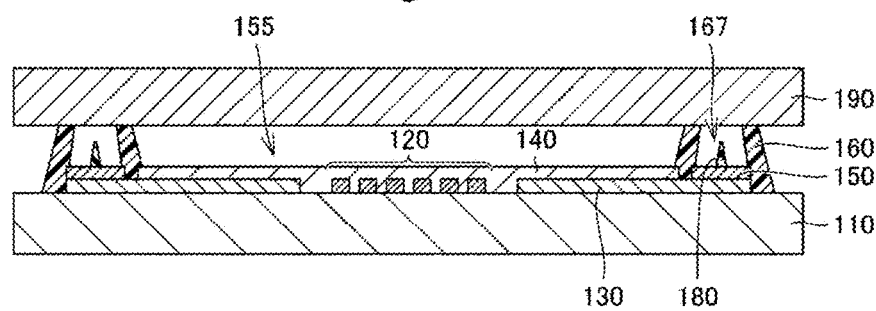
Figure 8D:
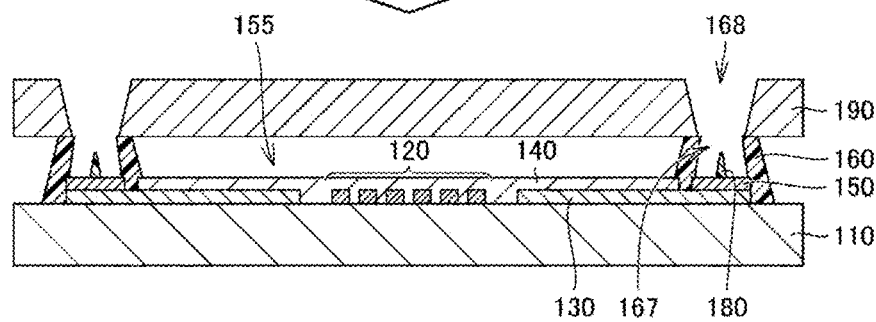
Figure 9E:
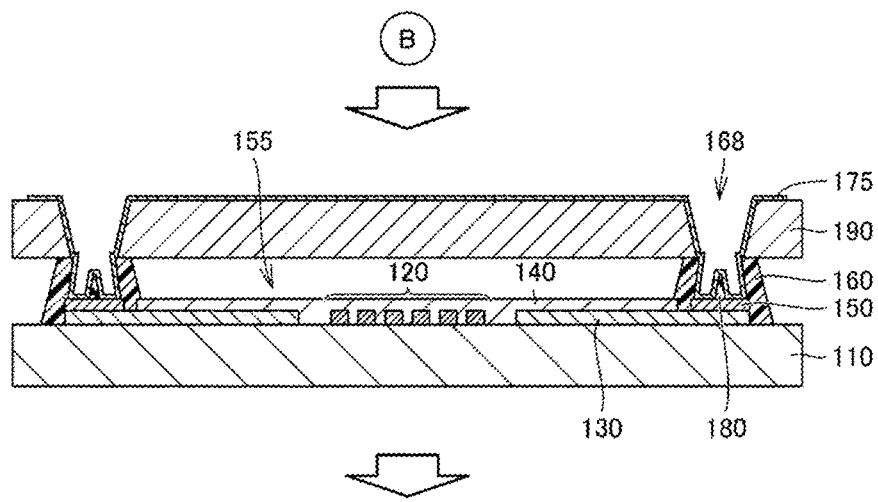
FIGS. 9E to 9G are second views for explaining the second example process of manufacturing the electronic component according to the present preferred embodiment of the present invention.
Figure 9F:
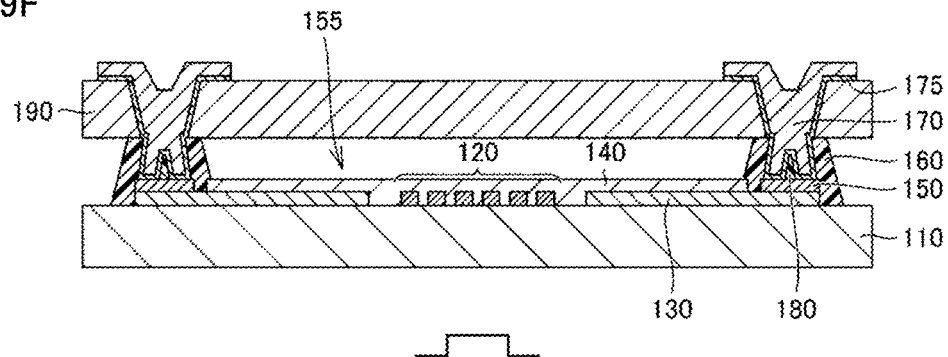
Figure 9G:
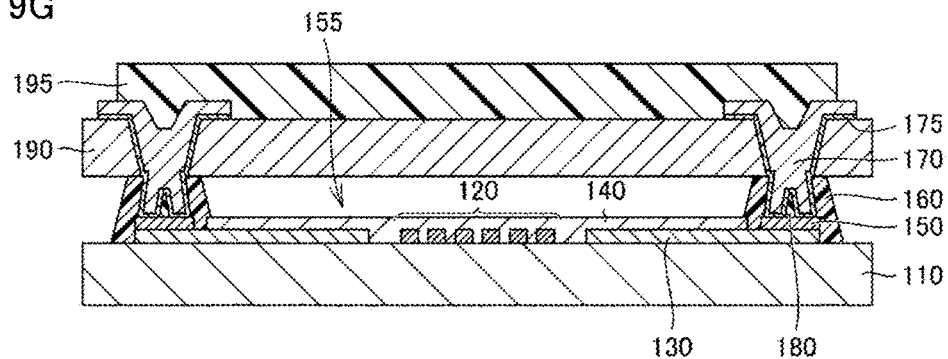

Referring to FIGS. 8A to 8D and 9E to 9G, the second example process of manufacturing the electronic component 100 will be described. The manufacturing process includes steps shown in FIGS. 8A to 8D and 9E to 9G. Note that FIGS. 9E to 9G are similar to those described in the first example process in relation to FIGS. 6E to 6G. Accordingly, description of the second example process will focus on FIGS. 8A to 8D.

Referring to FIG. 8A, the functional elements 120, the wiring electrodes 130, and the terminal electrodes 150 are formed on the piezoelectric substrate 110 using a similar method for the first example process.

In FIG. 8B, the support body 160 is formed using a photosensitive resin. More specifically, a photosensitive resin sheet is laminated on the workpiece produced in FIG. 8A. Regions of the photosensitive resin sheet except for where the support body 160 is formed are masked, and the photosensitive resin sheet is exposed to light. Since the photosensitive resin sheet is a negative photoresist, the regions exposed to light are cured. In the developing process, the light-exposed regions remain on the workpiece and the other regions are dissolved in the developing solution and washed away.

Meanwhile, the regions at which through-holes 167 are to be formed through the support body 160 are also masked. Here, as illustrated in FIG. 10, irradiation light is refracted by the edge of a mask 210, and a central portion at the bottom in the through-hole 167 is exposed to the refracted light. This leaves a substantially conical remnant of the photosensitive resin near the bottom of the through-hole 167 after the development, and the conical remnant becomes the projection 180. In the second example process, the projection 180 is made of the same material as the support body 160.

Next, in FIG. 8C, the cover portion 190 made of a photosensitive resin is laminated over the workpiece produced in FIG. 8B. Subsequently, in FIG. 8D, through-holes 168 are formed, using the same photo-processing as used in FIG. 8B above, in the cover portion 190 at positions corresponding to the through-holes 167 of the support body 160.

The workpiece is subsequently processed through the same steps as described in FIGS. 6E to 6G, thus forming the seed layer 175, the connection electrodes 170, and the protective layer 195. Thus, the electronic component 100 is completed.

As described above, the electronic component 100 having the structure illustrated in FIG. 1 is formed through the steps shown in FIGS. 8A to 8D and 9E to 9G.

Third Example Process

Figure 11A:
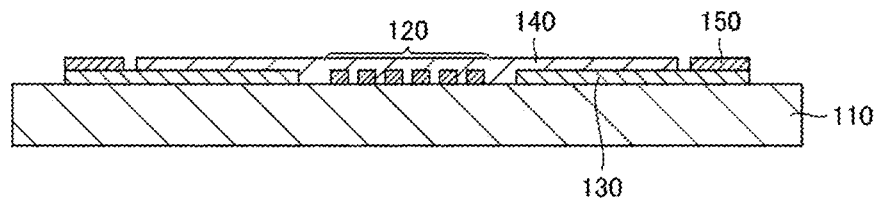
FIGS. 11A to 11D are first views for explaining a third example process of manufacturing the electronic component according to the present preferred embodiment of the present invention.
Figure 11B:
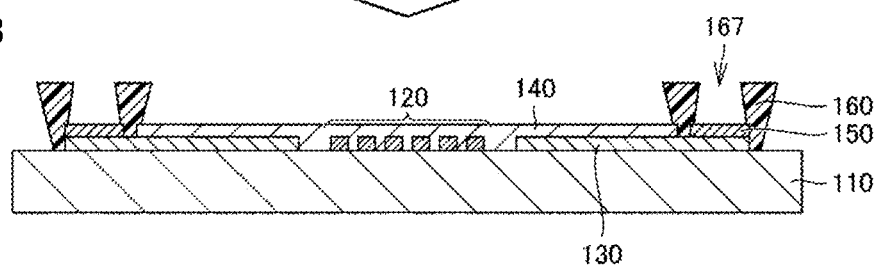
Figure 11C:
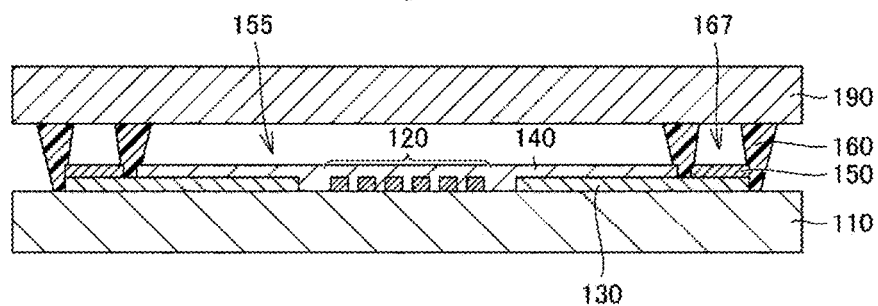
Figure 11D:
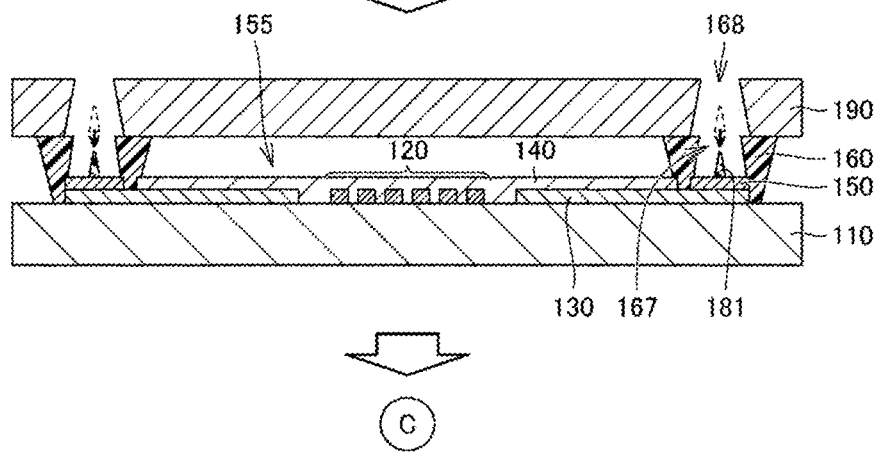
Figure 12E:
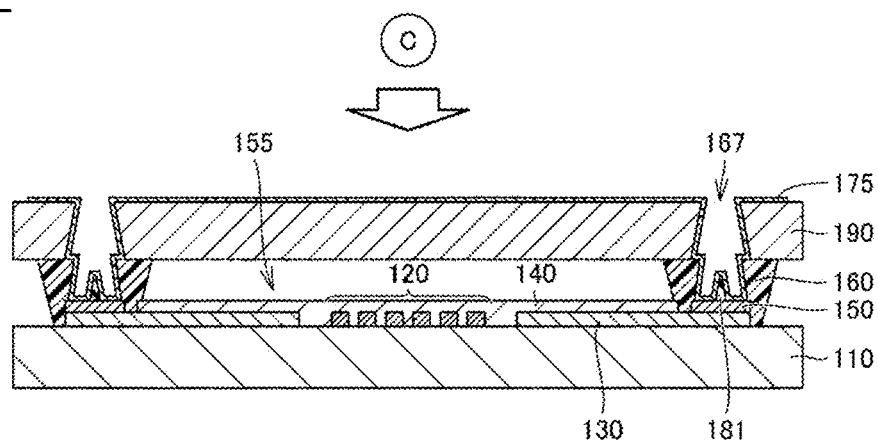
FIGS. 12E to 12G are second views for explaining the third example process of manufacturing the electronic component according to the present preferred embodiment of the present invention.
Figure 12F:
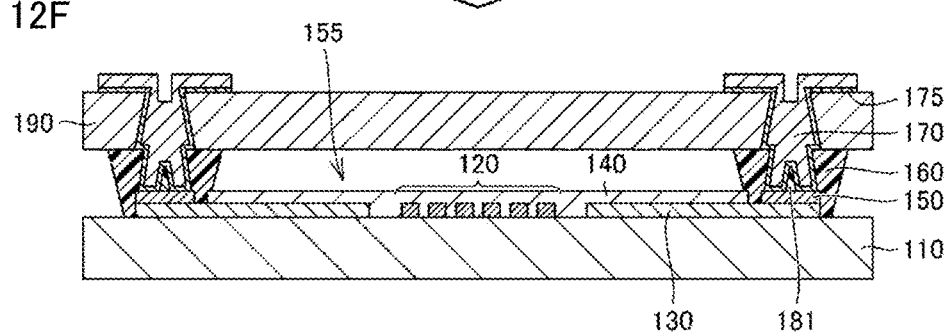
Figure 12G:
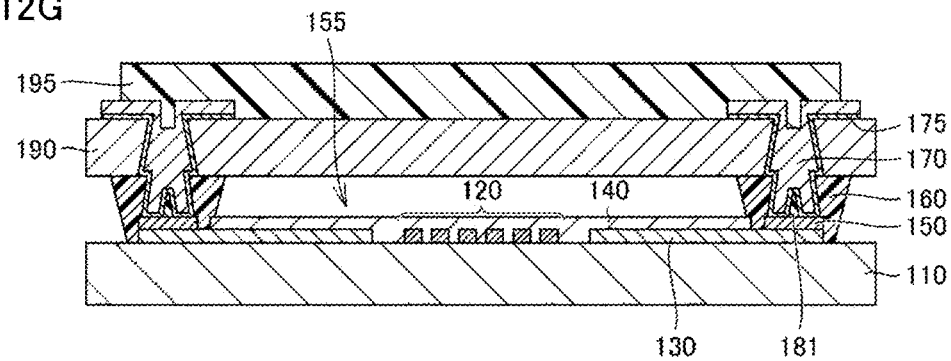

Referring to FIGS. 11A to 11D and 12E to 12G, the third example process of manufacturing the electronic component 100 will be described. The manufacturing process includes steps shown in FIGS. 11A to 11D and 12E to 12G. Note that steps FIGS. 12E to 12G are similar to those described in the first example process in relation to FIGS. 6E to 6G. Accordingly, description of the third example process will focus on FIGS. 11A to 11D.

Referring to FIG. 11A, the functional elements 120, the wiring electrodes 130, and the terminal electrodes 150 are formed on the piezoelectric substrate 110 using a similar method for the first example process.

In FIG. 11B, the support body 160 is formed using a photosensitive resin as is the case for FIG. 11B of the second example process. In FIG. 11B of the third example process, however, a remnant of the support body 160 does not remain in the through-hole 167 due to the optimization of development conditions after exposure and treatment conditions of resin remnants.

In FIG. 11C, the cover portion 190 made of a photosensitive resin is laminated over the workpiece produced in FIG. 11B. While the cover portion 190 is laminated, a slightly greater pressure may be applied to a portion of the cover portion 190 that will become the support body 160. As a result, as illustrated in FIG. 11C, the portions of the cover portion 190 that corresponds to the through-holes 167 hang down slightly.

When the photo-processing is performed with this state in FIG. 11D, the through-hole 168 is formed in the cover portion 190. Meanwhile, a central region of each hang-down portion of the cover portion 190 is exposed to light and cured in the manner described in relation to FIG. 10. When unexposed portions are removed in the development process, the above cured portion of the cover portion 190 drops on the terminal electrode 150 and becomes the projection 181. Accordingly, in the third example process, the projection 180 is made of the same material as the cover portion 190. Thus, in FIG. 11D, the through-holes that pierce the cover portion 190 and the support body 160 are formed, and the projections 181 are also formed at respective bottoms in the through-holes.

The workpiece is subsequently processed through the same steps as described in FIGS. 6E to 6G, thus forming the seed layer 175, the connection electrodes 170, and the protective layer 195. Thus, the electronic component 100 is completed.

As described above, the electronic component 100 having the structure illustrated in FIG. 1 is formed through the steps shown in FIGS. 11A to 11D and 12E to 12G.

Note that in the above description, the electronic component is described as the surface acoustic wave (SAW) device by way of example. Preferred embodiments of the present disclosure, however, are applicable to an electronic component other than the SAW device insofar as the electronic component is configured to include a hollow space therein and have a functional element located in the hollow space. For example, the electronic component may be a bulk acoustic wave (BAW) device or a MEMS device in which a miniature sensor or actuator is provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component, comprising:
a substrate;
a functional element on the substrate;
a first electrode on the substrate and electrically connected to the functional element;
a support body made of an insulator and protruding from the substrate and covering the first electrode;
a cover portion opposing the substrate and supported by the support body;
a second electrode in a via hole extending through the support body and the cover portion and electrically connected to the first electrode; and
a projection on the first electrode in the via hole; wherein
a hollow space is defined by the substrate, the support body, and the cover portion;
the functional element is located in the hollow space; and
the projection is made of an insulator and is completely covered by the second electrode.

2. The electronic component according to claim 1, wherein a plurality of the functional elements are provided on the substrate.

3. The electronic component according to claim 2, further comprising wiring electrodes to connect the plurality of functional elements to each other and to connect the plurality of functional elements to connection electrodes.

4. The electronic component according to claim 2, wherein the support body is wall-shaped and surrounds the plurality of functional elements.

5. The electronic component according to claim 1, wherein the second electrode includes a plated material.

6. The electronic component according to claim 1, wherein the projection is made of a material of the support body.

7. The electronic component according to claim 1, wherein the projection is made of a material of the cover portion.

8. The electronic component according to claim 1, wherein the projection has a height smaller than one-third of a height of the support body.

9. The electronic component according to claim 1, wherein the projection is at a central portion of a bottom in the via hole.

10. The electronic component according to claim 1, wherein
the substrate is a piezoelectric substrate;
the functional element includes interdigital transducer electrodes; and
the piezoelectric substrate and the IDT electrodes define a surface acoustic wave resonator.

11. The electronic component according to claim 1, further comprising protective layer covering the functional element.

12. The electronic component according to claim 1, wherein the functional element is a surface acoustic wave device.

13. The electronic component according to claim 1, wherein a portion of the support body covers terminal electrodes.

14. The electronic component according to claim 1, wherein the cover portion includes at least one of a resin, a photosensitive resin, or a metal.

15. The electronic component according to claim 1, wherein the projection is structured to prevent a cavity.

* * * * *